(12) United States Patent
Houle et al.

(10) Patent No.: US 7,821,126 B2
(45) Date of Patent: Oct. 26, 2010

(54) HEAT SINK WITH PREATTACHED THERMAL INTERFACE MATERIAL AND METHOD OF MAKING SAME

(75) Inventors: Sabina J. Houle, Phoenix, AZ (US); Carl Deppisch, Phoeniz, AZ (US)

(73) Assignee: Intel Corporation, Santa Clara, CA (US)

( * ) Notice: Subject to any disclaimer, the term of this patent is extended or adjusted under 35 U.S.C. 154(b) by 413 days.

(21) Appl. No.: 12/044,581

(22) Filed: Mar. 7, 2008

(65) Prior Publication Data

US 2008/0174007 A1    Jul. 24, 2008

Related U.S. Application Data

(62) Division of application No. 10/405,095, filed on Mar. 31, 2003, now Pat. No. 7,416,922.

(51) Int. Cl.
H01L 23/34 (2006.01)
(52) U.S. Cl. ....................................... 257/712
(58) Field of Classification Search ........................ None
See application file for complete search history.

(56) References Cited

U.S. PATENT DOCUMENTS

| | | | |
|---|---|---|---|
| 3,790,866 A | | 2/1974 | Meyer et al. |
| 3,797,103 A | | 3/1974 | Desmond et al. |
| 4,245,769 A | * | 1/1981 | Meginnis ................. 228/173.3 |
| 4,252,263 A | * | 2/1981 | Houston ..................... 228/193 |
| 4,544,942 A | | 10/1985 | McCarthy |
| 4,605,343 A | * | 8/1986 | Hibbs et al. .................. 407/119 |
| 4,654,966 A | | 4/1987 | Kohara et al. |
| 4,782,893 A | | 11/1988 | Thomas |
| 5,098,320 A | | 3/1992 | Colleran et al. |
| 5,146,314 A | | 9/1992 | Pankove |
| 5,230,459 A | * | 7/1993 | Mueller et al. .............. 228/164 |
| 5,291,371 A | | 3/1994 | Gruber et al. |
| 5,528,075 A | | 6/1996 | Burns |
| 5,700,340 A | | 12/1997 | Johnson et al. |
| 5,759,873 A | | 6/1998 | Kata et al. |
| 5,820,014 A | | 10/1998 | Dozier, II et al. |

(Continued)

FOREIGN PATENT DOCUMENTS

WO     WO-02091395 A1     11/2002

(Continued)

OTHER PUBLICATIONS

"U.S. Appl. No. 10/405,095, Response filed Jan. 4, 2005 to Non-Final Office Action mailed Nov. 2, 2004", 5 pgs.

(Continued)

Primary Examiner—Scott B Geyer
(74) Attorney, Agent, or Firm—John N. Greaves

(57) ABSTRACT

A process of making an integrated heat spreader is disclosed. The integrated heat spreader is stamped with a thermal interface material under conditions to form a diffusion bonding zone between the integrated heat spreader and the thermal interface material. The thermal interface material can have one of several cross-sectional profiles to facilitate reflow thereof against a die during a method of assembling a packaged microelectronic device. The thermal interface material can also have one of several footprints to further facilitate reflow thereof against the die.

12 Claims, 7 Drawing Sheets

U.S. PATENT DOCUMENTS

| | | | |
|---|---|---|---|
| 5,904,796 A | 5/1999 | Freuler et al. | |
| 5,907,189 A | 5/1999 | Mertol | |
| 5,931,222 A | 8/1999 | Toy et al. | |
| 5,981,085 A | 11/1999 | Ninomiya et al. | |
| 6,008,988 A | 12/1999 | Palmer | |
| 6,022,426 A | 2/2000 | Mennucci et al. | |
| 6,032,362 A | 3/2000 | Okikawa et al. | |
| 6,085,833 A * | 7/2000 | Kimura et al. | 165/185 |
| 6,099,678 A | 8/2000 | Kotato et al. | |
| 6,111,322 A | 8/2000 | Ando et al. | |
| 6,114,048 A | 9/2000 | Jech et al. | |
| 6,197,859 B1 | 3/2001 | Green et al. | |
| 6,219,243 B1 | 4/2001 | Ma et al. | |
| 6,226,187 B1 | 5/2001 | Questad et al. | |
| 6,292,367 B1 | 9/2001 | Sikka et al. | |
| 6,295,200 B1 | 9/2001 | Schmidt | |
| 6,343,647 B2 | 2/2002 | Kim et al. | |
| 6,430,043 B1 | 8/2002 | Osburn | |
| 6,451,155 B1 | 9/2002 | Toy et al. | |
| 6,462,410 B1 | 10/2002 | Novotny et al. | |
| 6,475,429 B2 | 11/2002 | Osada et al. | |
| 6,504,242 B1 | 1/2003 | Deppisch et al. | |
| 6,555,250 B2 * | 4/2003 | Shah et al. | 428/652 |
| 6,555,906 B2 | 4/2003 | Towle et al. | |
| 6,602,777 B1 | 8/2003 | Kao et al. | |
| 6,667,548 B2 | 12/2003 | O'Connor et al. | |
| 6,707,073 B1 | 3/2004 | Yamamoto et al. | |
| 6,751,099 B2 | 6/2004 | Vrtis et al. | |
| 6,784,540 B2 | 8/2004 | Cardwell | |
| 6,791,839 B2 | 9/2004 | Bhagwagar | |
| 6,803,328 B2 | 10/2004 | McCullough | |
| 6,818,477 B2 | 11/2004 | Veitschegger et al. | |
| 6,867,978 B2 | 3/2005 | Whittenburg et al. | |
| 6,895,026 B2 * | 5/2005 | Miyajima et al. | 372/36 |
| 6,987,671 B2 | 1/2006 | Houle | |
| 7,027,477 B2 | 4/2006 | Sutter et al. | |
| 2001/0006041 A1 | 7/2001 | Wensel | |
| 2002/0092163 A1 | 7/2002 | Fraivillig | |
| 2002/0135984 A1 | 9/2002 | Greenwood et al. | |
| 2003/0134454 A1 | 7/2003 | Houle | |
| 2003/0150604 A1 | 8/2003 | Koning et al. | |
| 2003/0178720 A1 | 9/2003 | Rumer et al. | |
| 2003/0178730 A1 | 9/2003 | Rumer et al. | |
| 2004/0066630 A1 | 4/2004 | Whittenburg et al. | |
| 2004/0118501 A1 | 6/2004 | Chiu et al. | |
| 2004/0124526 A1 | 7/2004 | Matayabas, Jr. et al. | |
| 2004/0125563 A1 | 7/2004 | Vrtis | |
| 2004/0180202 A1 | 9/2004 | Lawton et al. | |
| 2004/0180474 A1 | 9/2004 | Oman | |
| 2004/0184226 A1 | 9/2004 | Hall | |
| 2004/0261980 A1 | 12/2004 | Dani et al. | |
| 2004/0262372 A1 | 12/2004 | Houle et al. | |
| 2004/0262743 A1 | 12/2004 | Houle et al. | |
| 2004/0264136 A1 | 12/2004 | Houle | |
| 2005/0027055 A1 | 2/2005 | Dani et al. | |
| 2005/0045855 A1 | 3/2005 | Tonapi et al. | |
| 2005/0056365 A1 | 3/2005 | Chan | |

FOREIGN PATENT DOCUMENTS

| | | | |
|---|---|---|---|
| WO | WO-2005006361 A2 | 1/2005 | |
| WO | WO-2005006361 A3 | 1/2005 | |

OTHER PUBLICATIONS

"U.S. Appl. No. 10/612,834, Response filed Apr. 3, 2006 to Non-Final Office Action mailed Dec. 1, 2005 ", 10 pgs.

"U.S. Appl. No. 10/05,095, Non-Final Office Action mailed Jul. 13, 2006", 11 pgs.

"U.S. Appl. 10/405,095 Notice of Allowance mailed Dec. 11, 2007", 5 pgs.

"U.S. Appl. No. 10/405,095, Final Office Action mailed Nov. 20, 2006", 11 pgs.

"U.S. Appl. No. 10/405,095, Final Office Action mailed Mar. 13, 2006", 10 pgs.

"U.S. Appl. No. 10/405,095, Final Office Action mailed Mar. 22, 2005", 9 pgs.

"U.S. Appl. No. 10/405,095, Non-Final Office Action mailed Nov. 2, 2004", 8 pgs.

"U.S. Appl. No. 10/405,095, Non-Final Office Action mailed Aug. 4, 2005", 10 pgs.

"U.S. Appl. No. 10/405,095, Response filed Feb. 20, 2007 to Final Office Action mailed Nov. 20, 2006", 11 pgs.

"U.S. Appl. No. 10/405,095, Response filed May 16, 2006 to Final Office Action mailed Mar. 13, 2006", 12 pgs.

"U.S. Appl. No. 10/405,095, Response filed May 24, 2005 to Final Office Action mailed Mar. 22, 2005", 9 pgs.

"U.S. Appl. No. 10/405,095, Response filed Aug. 30, 2006 Non-Final Office Action mailed Jul. 13, 2006", 12 pgs.

"U.S. Appl. No. 10/405,095, Response filed Aug. 30, 2006 to Non-Final Office Action mailed Jul. 13, 2006", 14 pgs.

"U.S. Appl. No. 10/608,405, Non-Final Office Action mailed Mar. 22, 2005", 5 pgs.

"U.S. Appl. No. 10/608,405, Notice of Allowance mailed Aug. 8, 2005", 2 pgs.

"U.S. Appl. No. 10/608,405, Response filed May 23, 2005 to Non-Final Office Action mailed Mar. 22, 2005", 8 pgs.

"U.S. Appl. No. 10/612,834, Notice of Allowance mailed Feb. 26, 2008", 7 pgs.

"U.S. Appl. No. 10/612,834, Notice of Allowance mailed Oct. 10, 2007", 5 pgs.

"U.S. Appl. No. 10/612,834, Final Office Action mailed Jul. 27, 2005", 7 pgs.

"U.S. Appl. No. 10/612,834, Non-Final Office Action mailed Dec. 1, 2005", 6 pgs.

"U.S. Appl. No. 10/612,834, Non-Final Office Action mailed Sep. 11, 2006", 7 pgs.

"U.S. Appl. No. 10/612,834, Non-Final Office Action mailed Sep. 8, 2004", 5 pgs.

"U.S. Appl. No. 10/612,834, Notice of Allowance mailed Apr. 24, 2007", 3 pgs.

"U.S. Appl. No. 10/612,834, Response filed Nov. 8, 2004 to Non-Final Office Action mailed Sep. 8, 2004", 8 pgs.

"U.S. Appl. No. 10/612,834, Response filed Dec. 11, 2006 to Non-Final Office Action mailed Sep. 11, 2006", 9 pgs.

"U.S. Appl. No. 10/612,834, Response filed Sep. 8, 2005 to Final Office Action mailed Jul. 27, 2005", 9 pgs.

"Application Serial No. 10-607738 Non-final office action mailed May 26, 2005 ", 7 pgs.

"Application Serial No. 10-607738 Notice of allowance mailed Sep. 23, 2005", 5 pgs.

"Application Serial No. 10-607738 Response filed Jul. 25, 2005 to non-final office action mailed May 26, 2005 ", 21 pgs.

Chang, Chin-An "Enhanced Cu-Teflon adhesion by presputtering treatment: Effect of surface morphology changes", *Applied Physics Letters*, 51(16), (Oct. 19, 1987),1236-1238.

Perrins, L E., et al., "Mechanism for the adhesion of electroplated copper to polypropylene", *Plastics and Polymers*, 39(144), (Dec. 1971),391-397.

* cited by examiner

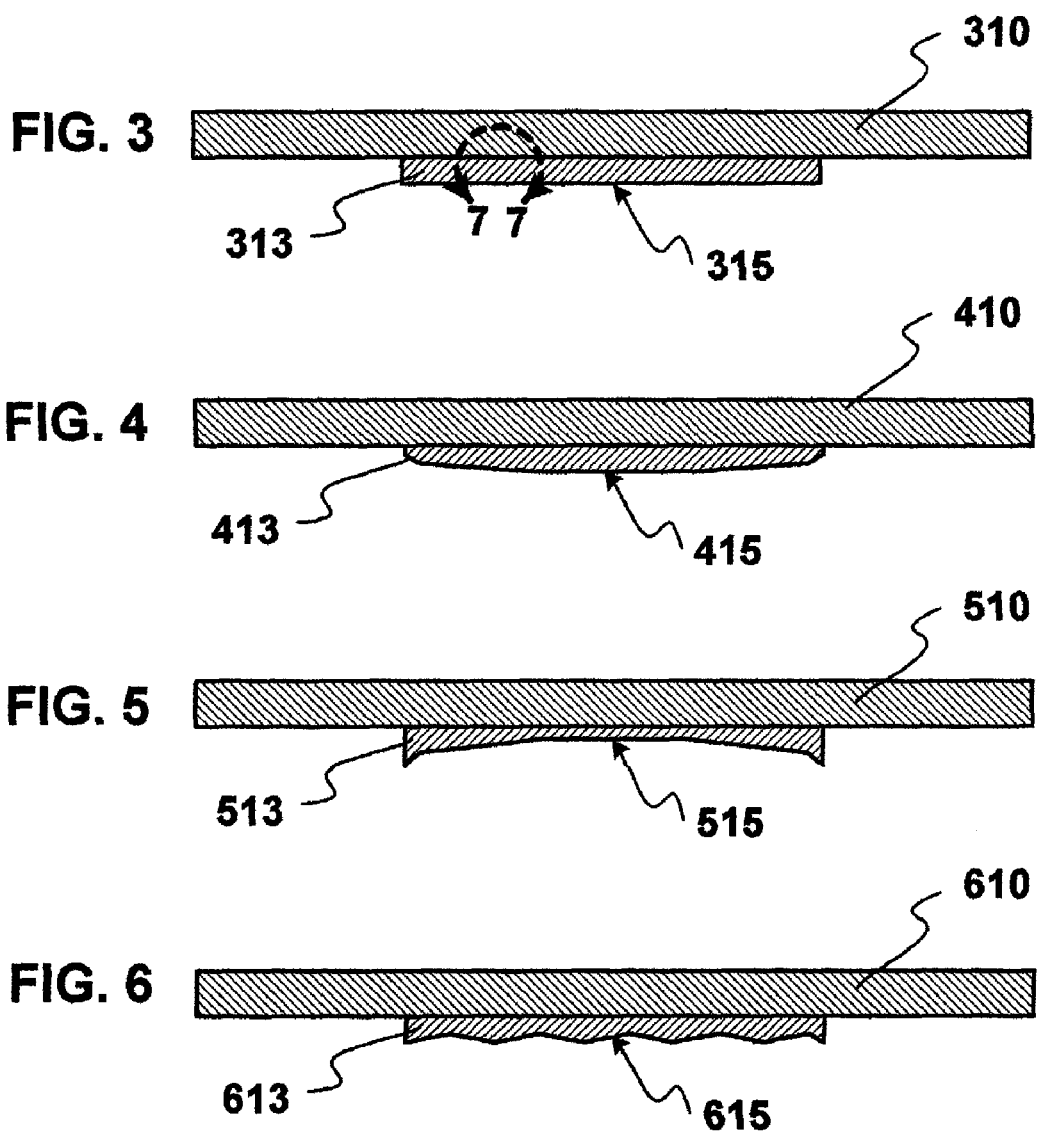

HEAT SINK WITH PREATTACHED THERMAL INTERFACE MATERIAL AND METHOD OF MAKING SAME

This application is a divisional of U.S. application Ser. No. 10/405,095, filed on Mar. 31, 2003 now U.S. Pat. No. 7,416,922, which is incorporated herein by reference in its entirety.

TECHNICAL FIELD

Disclosed embodiments relate to a thermal interface material for an integrated heat spreader. The thermal interface material is stamped from a rolled stock or flat sheet stock, directly onto an integrated heat spreader, or onto a heat sink in general such as an integrated heat spreader preform.

BACKGROUND INFORMATION

Description of Related Art

An integrated circuit (IC) die is often fabricated into a microelectronic device such as a processor. The increasing power consumption of processors results in tighter thermal budgets for a thermal solution design when the processor is employed in the field. Accordingly, a thermal interface solution is often needed to allow the die to reject heat more efficiently.

Various techniques have been employed to transfer heat away from a die. These techniques include passive and active configurations. One passive configuration involves a conductive material in thermal contact with the backside of a packaged die. This conductive material is often a heat pipe, heat sink, a slug, a heat spreader, or an integrated heat spreader (IHS).

A heat spreader is employed to spread and dissipate the heat generated by a die, and to minimize concentrated high-heat locations within the die. A heat spreader is attached proximate the back side of a microelectronic die with a thermally conductive material, such as a thermal interface material (TIM). A TIM can include, for example, thermally conductive polymers, thermal greases, polymer/solder hybrids, or solders. Heat spreaders include materials such as aluminum, copper, copper alloy, ceramic, carbon-filled materials, and diamond-filled materials, among others.

With conventional technology, a packaged microelectronic device includes a die that is bonded from the back side to an integrated heat spreader (IHS). An IHS adhesive layer acts as a TIM to bond the die to the IHS and to transfer heat away from the die.

BRIEF DESCRIPTION OF THE DRAWINGS

In order to understand the manner in which embodiments are obtained, a more particular description of various embodiments briefly described above will be rendered by reference to the appended drawings. Understanding that these drawings depict only typical embodiments that are not necessarily drawn to scale and are not therefore to be considered to be limiting of its scope, some embodiments will be described and explained with additional specificity and detail through the use of the accompanying drawings in which:

FIG. 3 is a cross section of a TIM-stamped heat spreader assembly according to an embodiment;

FIG. 4 is a cross section of a TIM-stamped heat spreader assembly according to an embodiment;

FIG. 5 is a cross section of a TIM-stamped heat spreader assembly according to an embodiment;

FIG. 6 is a cross section of a TIM-stamped heat spreader assembly according to an embodiment;

DETAILED DESCRIPTION

The following description includes terms, such as upper, lower, first, second, etc. that are used for descriptive purposes only and are not to be construed as limiting. The embodiments of a device or article described herein can be manufactured, used, or shipped in a number of positions and orientations. The terms "die" and "processor" generally refer to the physical object that is the basic workpiece that is transformed by various process operations into the desired integrated circuit device. A board is typically a resin-impregnated fiberglass structure that acts as a mounting substrate for the die. A die is usually singulated from a wafer, and wafers may be made of semiconducting, non-semiconducting, or combinations of semiconducting and non-semiconducting materials.

Reference will now be made to the drawings wherein like structures will be provided with like reference designations. In order to show the structures of embodiments most clearly, the drawings included herein are diagrammatic representations of various embodiments. Thus, the actual appearance of the fabricated structures, for example in a photomicrograph, may appear different while still incorporating the essential structures of embodiments. Moreover, the drawings show only the structures necessary to understand the embodiments. Additional structures known in the art have not been included to maintain the clarity of the drawings.

Figure 1A:
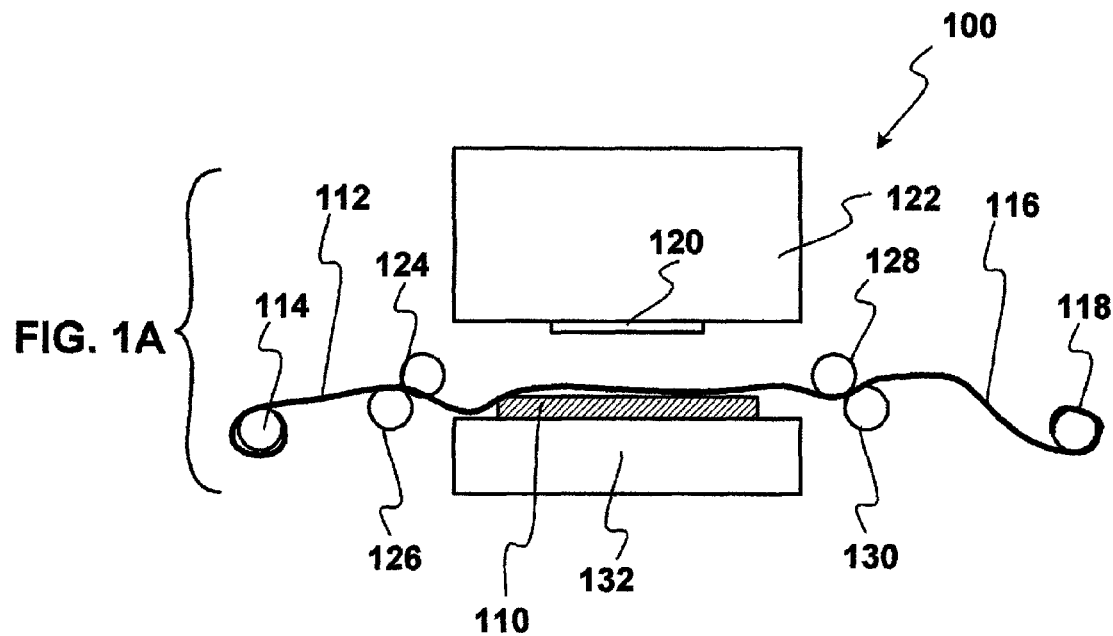
FIG. 1A is a cross-section of an assembly which depicts a stamping process according to an embodiment.

FIG. 1A is a cross-section of an assembly which depicts a stamping process 100 according to an embodiment. The stamping process 100 includes a heat spreader substrate 110 and a thermal interface material (TIM) 112. The TIM 112 is roll stock that is fed from a supply 114. Thereafter, after-process salvage 116, which is referred to as unbonded TIM 116, is collected at a TIM salvage 118. In one embodiment, a flux film (not pictured) is provided on the TIM 112. The flux film resists the formation of oxides on the TIM 112. In one embodiment, no flux film is provided on the TIM 112. In this embodiment, processing conditions effectively fracture an oxide film if present.

A press positive 120 is mounted on a press 122. The press positive 120 contains a shape that is transferred through the TIM 112 when the press 122 is articulated against the heat spreader substrate 110. According to an embodiment, various rollers 124 and 126 are used for processing convenience to assist feeding the supply 114 under the press 122. According to an embodiment, other various rollers 128 and 130 are used for processing convenience to assist in removing the unbonded TIM 116 from under the press 122.

In one embodiment, a substantially flat sheet stock material (not pictured) instead of the roll sheet stock material fed by the supply 114, is placed under the press 122, and at least two TIMs are pressed out of the sheet according to a pattern similar to a "printer's galley sheet". In one embodiment, a single flat sheet stock material is singly stamped, and the unstamped portion thereof is salvaged.

In addition to a roll stock and a substantially flat sheet stock material set forth above, a pre-formed shape is supplied in what is commonly known as the tape and reel technique. The TIMs depicted in FIGS. 9-13 are provided as non-limiting examples of various shapes that can be pre-formed and placed inside a cell of a tape and reel. According to this embodiment, a pick-and-place technique is used to remove a given TIM from a tape and reel cell, and to place and align it upon a heat spreader substrate.

In addition to a pre-formed shape that can be placed into a tape and reel cell for a pick-and-place technique, the pre-formed shape itself can have different regions that have higher coefficients of heat transfer than other regions. In such an embodiment, the TIM includes a first heat transfer material and at least a second heat transfer material with a higher coefficient of heat transfer than the first heat transfer material. In one embodiment, where the first heat transfer material contains an organic composition, the organic composition may be a polymer, a resin, or a combination thereof according to a specific application. In another embodiment, the first heat transfer material is an organic-inorganic composite. The organic-inorganic composite in one embodiment includes a polymer, optionally an inorganic dielectric, and optionally at least one metallic. The inorganic dielectric may be a material as is used as filler in thermal interface structures. One embodiment of an inorganic dielectric is fused silica and the like. Where a metallic is used as a portion of an organic-inorganic composite, the metallic in one embodiment is a low melting-point solder or the like.

In one embodiment, the second heat transfer material is discretely disposed in the first heat transfer material to facilitate removal heat from a hot spot on the die.

Figure 1B:
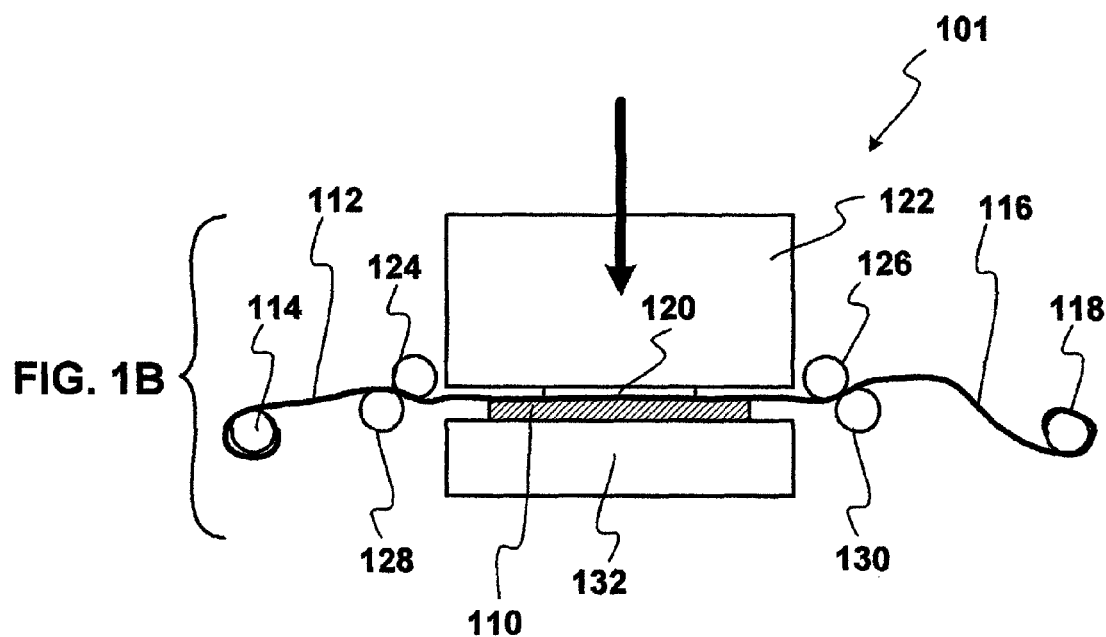
FIG. 1B is a cross-section of the assembly depicted in FIG. 1 after further processing.

FIG. 1B is a cross-section of the assembly which depicts the stamping process 101 depicted in FIG. 1 after further processing. The press 122 has been articulated downwardly as indicated by the heavy vertical arrow. The press positive 120 has achieved a stamping process upon the TIM 112 against the heat spreader substrate 110.

In one embodiment, the press 122 includes a support 132. The support 132 is used to maintain the heat spreader substrate 110 during stamping of the TIM 112 out of the supply 114, and onto the heat spreader substrate 110. The support 132 is also used to preheat the TIM 112 for a given application. In one embodiment, the TIM 112 is cold-stamped at room temperature. In one embodiment, the TIM 112 is pre-heated from the support 132 and stamped at a temperature about one-half the value between room temperature and the melting temperature of the TIM 112. Other temperatures can be achieved as set forth in non-limiting examples.

Figure 1C:
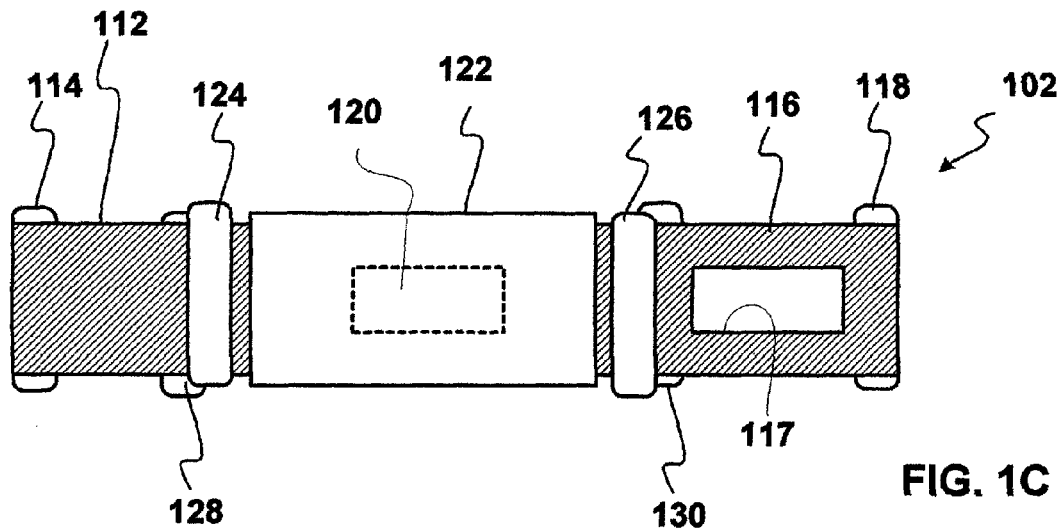
FIG. 1C is a top view of the assembly depicted in FIG. 1B after further processing.

FIG. 1C is a top view of the assembly which depicts the stamping process 102 depicted in FIG. 1B after further processing. After stamping the TIM 112, the supply 114 is drawn from to advance more material under the press 122. Accordingly, the unbonded TIM 116 is collected at the TIM salvage 118. FIG. 1C also depicts a TIM negative 117 that reveals the shape of the TIM which has been bonded with the heat spreader substrate 110 (FIG. 1B). The TIM negative 117 is formed by stamping the feed material, and by creating a shearing or otherwise sheet-weakening force to form the outline of the TIM negative 117.

Figure 2:
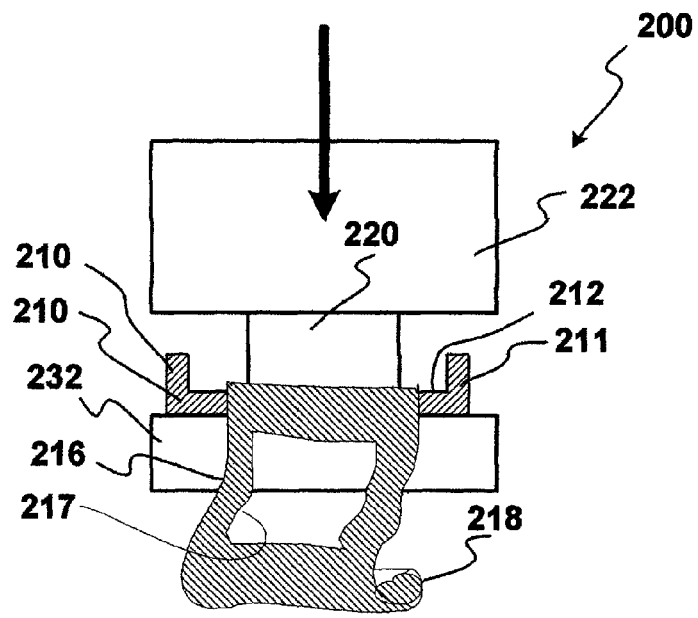
FIG. 2 is an elevation of an assembly which depicts a stamping process according to an embodiment.

FIG. 2 is an elevation of an assembly that depicts a stamping process 200 according to an embodiment. In one embodiment, a pre-formed heat spreader substrate 210 has taken a specific shape prior to the stamping process. In this embodiment, an integrated heat spreader (IHS) 210 is depicted. A press positive 220 is stamped against the TIM. The press positive is articulated against the TIM 212 by the action of a press 222 as indicated by the heavy downward vertical arrow. Since the IHS 210 has significant vertical dimensions, TIM 212 is advanced between lip portions 211 of the IHS 210 without damage to the lip portions 211. Thereafter, unbonded TIM 216 or salvage is withdrawn from the assembly after a stamping operation. FIG. 2 also depicts a TIM negative 217 that reveals the shape of the TIM that has been bonded with the IHS 210. A TIM salvage 218 accumulates unbonded TIM 216.

In one embodiment, the press 222 includes a support 232. The support 232 is used to maintain the IHS 210 during stamping of the TIM 212 onto the IHS 210. In one embodiment, the support is a heat source for processes described in this disclosure. Processing can otherwise be similar to the processing depicted in FIGS. 1A-1C.

In FIGS. 3-6, various TIM-stamped heat spreader embodiments are disclosed. In these embodiments as in all embodiments, the stamping process can be carried out by a slightly axis-pivoting technique that is functionalized for example as the Instron® technique, by Instron Corporation of Canton, Mass.

Another embodiment of applying a TIM to a heat spreader substrate includes the use of a roller instead of a stamping press. It should therefore be understood in one embodiment that where the claimed subject matter enumerates "stamping" or "TIM-stamped", the process of rolling is applicable.

Another embodiment of applying the TIM to the heat spreader substrate includes an operator applying hand pressure with the TIM against the heat spreader substrate instead of using a stamping press or a roll press. It should therefore be understood in one embodiment that where the claimed subject matter enumerates "stamping" or "TIM-stamped", the process of applying hand pressure is applicable.

FIG. 3 is a cross section of a TIM-stamped heat spreader assembly according to an embodiment. A heat spreader substrate 310 has been processed by stamping a TIM 313 according to a processing embodiment. In this embodiment, the TIM 313 has a rectangular profile 315.

FIG. 4 is a cross section of a TIM-stamped heat spreader assembly according to an embodiment. A heat spreader substrate 410 has been processed by stamping a TIM 413 according to a processing embodiment. In this embodiment, the TIM 413 has a convex profile 415.

FIG. 5 is a cross section of a TIM-stamped heat spreader assembly according to an embodiment. A heat spreader substrate 510 has been processed by stamping a TIM 513 according to a processing embodiment. In this embodiment, the TIM 513 has a concave profile 515.

FIG. 6 is a cross section of a TIM-stamped heat spreader assembly according to an embodiment. A heat spreader substrate 610 has been processed by stamping a TIM 613 according to a processing embodiment. In this embodiment, the TIM 613 has an undulating profile 615.

In one embodiment, the TIM has a combination of at least two of a rectangular profile, a convex profile, a concave profile, and an undulating profile. In one embodiment, the specific profile is impressed during the stamping process. In this embodiment, the press positive, such as the press positive 120 in FIG. 1A, has a contour that forms a selected profile. In one embodiment, the specific profile is impressed before the stamping process. In this embodiment, for example, the TIM 112 as it is fed from the supply 114, has a prepared contour. For example, the TIM 112 has a textured profile such as an undulating profile. In one embodiment, a given profile is selected to assist in achieving a low voids presence during reflow of a heat spreader assembly to a die.

Figure 7:
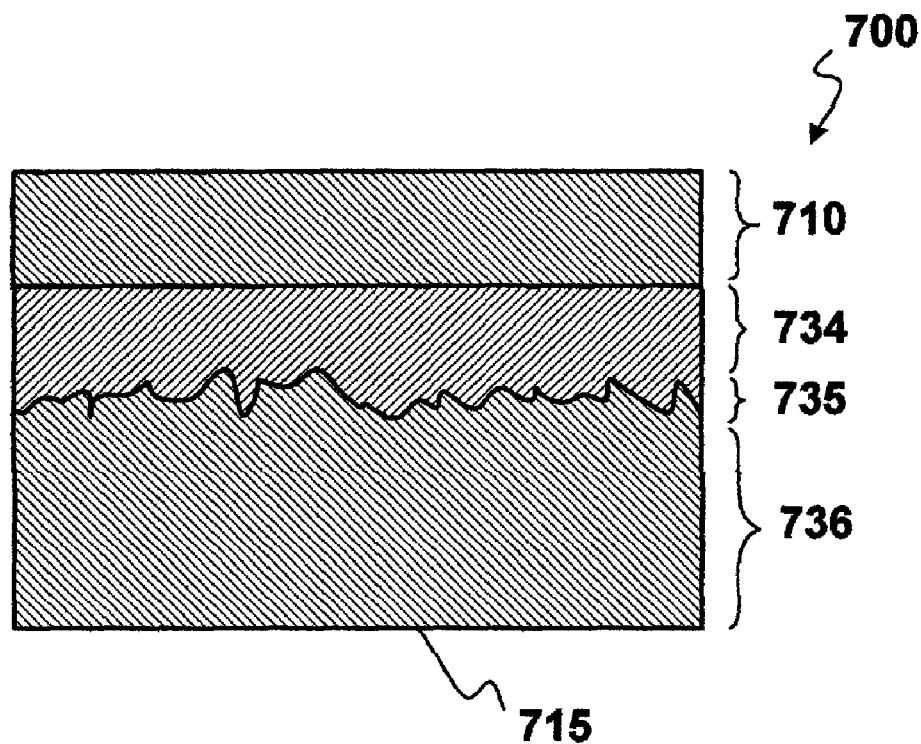
FIG. 7 is a section of the TIM-stamped heat spreader assembly depicted in FIG. 3, taken along the section line 7-7 according to an embodiment.

FIG. 7 is a section 700 of the heat spreader assembly in FIG. 3 depicted by way of non-limiting example, taken along the section line 7-7 according to an embodiment. The section 700 includes a heat spreader substrate 710 and a TIM layer 736. Additionally, a cladding layer 734 is pre-bonded to the heat spreader substrate 710. By "cladding layer", it is understood that a layer has been formed upon a heat sink structure such as the heat spreader substrate. Forming of a "cladding layer" thereon can include at least one of such diverse processes as pressure cladding, electroplating, electroless plating, and other processes.

In one embodiment, a rectangular blank of IHS-grade copper is drawn through a molten nickel or molten nickel alloy bath to form the cladding layer 734. Subsequently, the nickel or nickel alloy-clad rectangular blank is processed by stamping a TIM onto the heat spreader substrate 710 according to an embodiment.

During the stamping process such as is depicted in FIGS. 1A-1C, a diffusion bonding zone 735 forms between the heat spreader substrate 710 and the TIM layer 736. The diffusion bonding zone 735 is characteristic of such a stamping process. In this embodiment, the diffusion bonding zone 735 includes at least a portion of the cladding layer 734. The diffusion bonding zone 735 is formed during the stamping process according to conditions set forth in the various embodiments. In one embodiment, the diffusion bonding zone 735, as quantified by the right bracket 735, has a depth in a range from about 0.1 micrometer (micron) to about 10 micron. In one embodiment, the diffusion bonding zone 735 has a depth in a range from about 1 micron to about 5 micron.

In one embodiment, the diffusion bonding zone 735 is expansive enough to extend (not pictured) into the heat spreader substrate 710 (not pictured). In this embodiment, the cladding layer 734 thickness, the TIM temperature, and stamping pressure, or all three, are adjusted to cause expansion of the diffusion bonding zone 735 to overlap the entire cladding layer 734 and to extend into the heat spreader substrate 710. In one embodiment, the expansive diffusion bonding zone includes the thickness depicted by brackets 735, 734, and optionally a portion of 710. This expansive diffusion bonding zone includes a depth in a range from less than about 2 micron to about 20 micron.

The heat spreader substrate 710 depicted in FIG. 7 is therefore represented in one embodiment to be a nickel or nickel alloy-clad IHS-grade copper material. In one embodiment, the heat spreader substrate 710 is copper or a copper alloy. In one embodiment, the heat spreader substrate 710 is aluminum or an aluminum alloy. In one embodiment, the heat spreader substrate 710 includes a graphite material. In one embodiment, the heat spreader substrate 710 includes carbon structures such as carbon fibers and/or carbon particulates. In one embodiment, the heat spreader substrate 710 includes a high thermal conductivity material such as diamond. In one embodiment, the heat spreader substrate 710 includes a high thermal conductivity material formed from a consolidated metal powder.

The material of the cladding layer 734 is selected to provide adequate adhesion to the material of the heat spreader substrate 710 material under ordinary test and field usages. In one embodiment, the cladding layer 734 includes nickel or a nickel alloy. In one embodiment, the cladding layer 734 includes gold or a gold alloy. In one embodiment, the cladding layer 734 includes silver or a silver alloy. In one embodiment, the cladding layer 734 includes tin or a tin alloy. In one embodiment, the cladding layer 734 includes palladium or a palladium alloy. Other materials for the IHS and the cladding layer can be selected according to specific applications.

The material of the TIM 736 is selected to assist bonding both to the cladding layer 734 and to a die during a method of assembling a package as set forth in this disclosure. In one embodiment, a reactive solder system is used. A reactive solder material includes properties that allow for adhesive and/or heat-transfer qualities. For example, the reactive solder material can melt and resolidify without a pre-flux cleaning that was previously required. Further, a reactive solder embodiment can also include bonding without a metal surface. Without the need of a metal surface for bonding, processing can be simplified.

In one embodiment, a reactive solder includes a base solder that is alloyed with an active element material. In one embodiment, a base solder is indium. In one embodiment, a base solder is tin. In one embodiment, a base solder is silver. In one embodiment, a base solder is tin-silver. In one embodiment, a base solder is at least one lower-melting-point metal with any of the above base solders. In one embodiment, a base solder is a combination of at least two of the above base solders. Additionally, conventional lower-melting-point metals/alloys can be used.

The active element material is alloyed with the base solder. In one embodiment, the active element material is provided in a range from about 2% to about 30% of the total solder. In one embodiment, the active element material is provided in a range from about 2% to about 10%. In one embodiment, the active element material is provided in a range from about 0.1% to about 2%.

Various elements can be used as the active element material. In one embodiment, the active element material is selected from hafnium, cerium, lutetium, other rare earth elements, and combinations thereof. In one embodiment, the active element material is a refractory metal selected from titanium, tantalum, niobium, and combinations thereof. In one embodiment, the active element material is a transition metal selected from nickel, cobalt, palladium, and combinations thereof. In one embodiment, the active element material is selected from copper, iron, and combinations thereof. In one embodiment, the active element material is selected from magnesium, strontium, cadmium, and combinations thereof.

The active element material when alloyed with the base solder can cause the alloy to become reactive with a semiconductive material such as the backside surface of a die as set forth subsequently by this disclosure. The alloy can also become reactive with an oxide layer of a semiconductive material such as silicon oxide, gallium arsenide oxide, and the like. The alloy can also become reactive with a nitride layer of a semiconductive material such as silicon nitride, silicon oxynitride, gallium arsenide nitride, gallium arsenide oxynitride, and the like.

According to an embodiment, the TIM layer 736 includes a solder that may contain lead (Pb) or be a substantially Pb-free solder. By "substantially Pb-free solder," it is meant that the solder is not designed with Pb content according to industry trends. A substantially Pb-free solder in one embodiment includes an SnAgCu solder as is known in the art.

One example of a Pb-containing solder includes a tin-lead solder. In selected embodiments, Pb-containing solder is a tin-lead solder composition such as from 97% tin (Sn)/3% lead (Sn3Pb). A tin-lead solder composition that may be used is a Sn63Pb composition of 37% tin/63% lead. In any event, the Pb-containing solder may be a tin-lead solder comprising $Sn_xPb_y$, wherein x+y total 1, and wherein x is in a range from about 0.3 to about 0.99. In one embodiment, the Pb-containing solder is a tin-lead solder composition of Sn3Pb. In one embodiment, the Pb-containing solder is a tin-lead solder composition of Sn63Pb.

Figure 8:
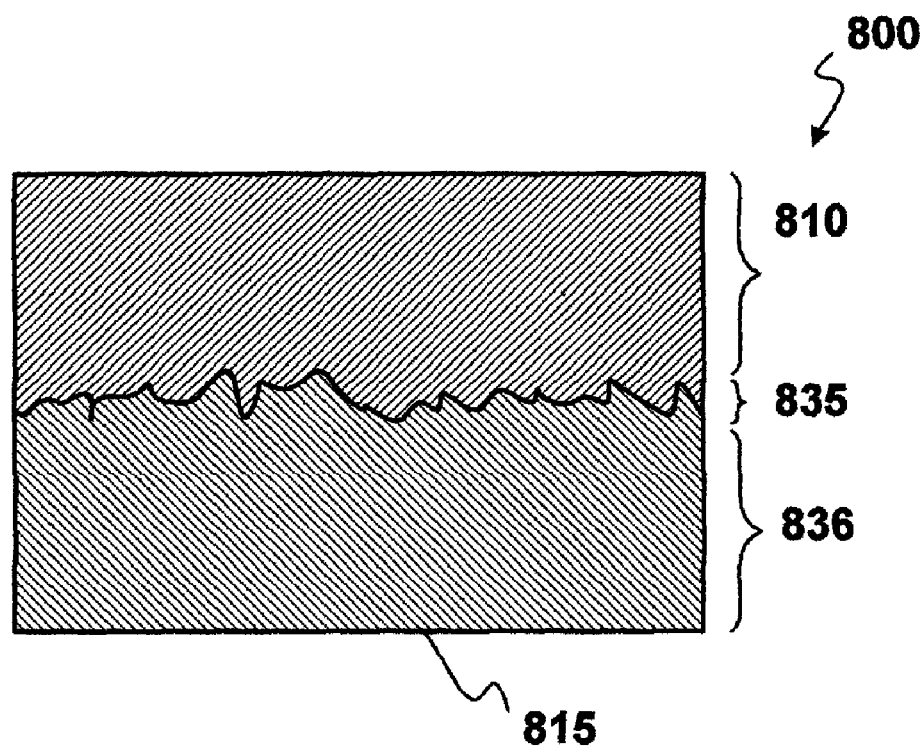
FIG. 8 is a section of the TIM-stamped heat spreader assembly depicted in FIG. 3, taken along the section line 7-7 according to an alternative embodiment.

FIG. 8 is a section 800 of the heat spreader assembly depicted in FIG. 3, taken along the section line 7-7 according to an alternative embodiment. The section 800 includes a heat spreader substrate 810 and a TIM layer 836. In this embodiment, no cladding layer is present.

During the stamping process such as is depicted in FIGS. 1A-1C, a diffusion bonding zone 835 forms between the heat spreader substrate 810 and the TIM layer 836. The diffusion bonding zone 835 is characteristic of a stamping process. The diffusion bonding zone 835 is formed during the stamping process according to conditions set forth in the various embodiments. In this embodiment, the TIM layer temperature and stamping pressure are adjusted to cause formation of the diffusion bonding zone 835.

For the embodiments depicted in FIGS. 7 and 8, processing conditions include a temperature range between ambient and about 160° C. In one embodiment, before stamping, the heat spreader substrate is heated above ambient. In one embodiment, stamping is carried out at a temperature for the thermal interface material according to an approximation $(T_{TIM} - T_{AMB})/2$. In this temperature approximation, $T_{TIM}$ is the Centigrade melting temperature of the TIM. Further, $T_{AMB}$ is the Centigrade ambient temperature. In one embodiment, the temperature is selected between ambient temperature and about 300° C.

The stamping pressure can depend upon the heat spreader substrate material, whether there is a cladding layer, and upon the material of the TIM. In one embodiment, a pressure in a range from about 0.25 pounds force per square inch to about 10,000 pounds force per square inch is used. In one embodiment, a pressure of about 200 pounds force per square inch is used. In one embodiment, a pressure of about 400 pounds force per square inch is used. In one embodiment, a pressure in a range from about 200 pounds force per square inch to about 400 pounds force per square inch is used.

Example 1

Reference is made to FIG. 1A, FIG. 1B, FIG. 3, and FIG. 7. In a first example, an IHS-grade copper heat spreader substrate 110 or 710 is clad with a nickel cladding layer 734. An indium TIM 112 is supplied to the press 122, and the press positive 120 is articulated in a stamping motion against the TIM 112. The TIM 112 is preheated by the support 132 to about 86° C., and the press positive 120 exerts a force of about 400 pounds per square inch.

After the stamping process, a heat sink assembly is achieved that includes a heat spreader substrate 310 (FIG. 3), and a TIM 313 with a rectangular profile 315. During the stamping process, a diffusion bonding zone 735 (FIG. 7) is formed between the heat spreader substrate 710 and the TIM layer 736. In this embodiment, the diffusion bonding zone 735 is an indium-nickel intermetallic compound (IMC) that includes at least a portion of the cladding layer 734.

Example 2

Reference is made to FIG. 1A, FIG. 1B, FIG. 3, and FIG. 8. In a second example, an IHS-grade copper heat spreader substrate 110 or 810 is stamped with an indium TIM 112. The indium TIM 112 is supplied to the press 122, and the press positive 120 is articulated in a stamping motion against the TIM 112. The TIM 112 is preheated by the support 132 to about 86° C., and the press positive 120 exerts a force of about 400 pounds per square inch.

After the stamping process a heat sink assembly is achieved that includes a heat spreader substrate 310 (FIG. 3), and a TIM 313 with a rectangular profile 315. During the stamping process, a diffusion bonding zone 835 (FIG. 8) is formed between the heat spreader substrate 810 and the TIM layer 836. In this embodiment, the diffusion bonding zone 835 is an indium-copper IMC.

The shape of the TIM on the heat spreader substrate can vary according to a given application. In one embodiment, the shape of the TIM is substantially the shape of the die against which it will be reflowed during a method of assembling a package as set forth herein. Other shapes can be selected for processing embodiments.

Figure 9:
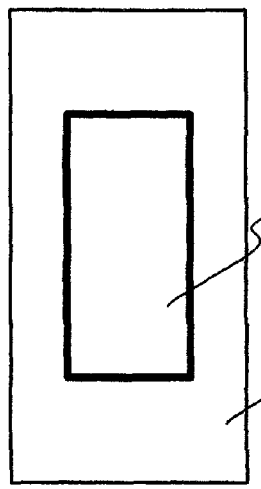
FIG. 9 is a plan schematic view of a TIM-stamped heat spreader assembly according to an embodiment.

FIG. 9 is a schematic plan view of a heat spreader assembly according to an embodiment. The heat spreader assembly includes a heat spreader substrate 910 according to the various embodiments set forth in this disclosure, and a TIM 912 according to the various embodiments set forth in this disclosure. By way of non-limiting example, the TIM 912 is an indium material and the heat spreader substrate 910 is a nickel-clad copper composite, although any of the materials combinations can be used as set forth in Examples 1 and 2, FIGS. 10-13, and elsewhere in this disclosure. The TIM 912 has a rectangular footprint, and a substantially convex cross-sectional profile.

FIG. 9 also demonstrates in one embodiment where the footprint of the TIM 912 is substantially the same as the footprint of the heat spreader substrate 910. This embodiment is also demonstrated in FIG. 2. The TIM 212 substantially fills the available space between the lip portions 211 of the IHS 210. Referring again to FIG. 9, because the TIM 912 has been stamped and a diffusion bonding zone has been formed, thermal processing such as reflow heating, does not necessarily allow the TIM 912 to soften and peel from the heat spreader substrate 910. Such peeling otherwise can lower process yield.

Figure 10:
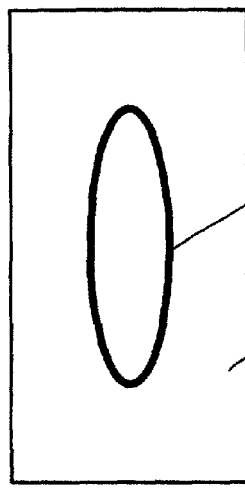
FIG. 10 is a plan schematic view of a TIM-stamped heat spreader assembly according to an embodiment.

FIG. 10 is a schematic plan view of a heat spreader assembly according to an embodiment. The heat spreader assembly includes a heat spreader substrate 1010 according to the various embodiments set forth in this disclosure, and a TIM 1012 according to the various embodiments set forth in this disclosure. By way of non-limiting example, the TIM 1012 is a tin-indium material and the heat spreader substrate 1010 is a silver-palladium-clad copper composite, although any of the materials combinations can be used as set forth in Examples 1 and 2, FIGS. 9 and 11-13, and elsewhere in this disclosure. The TIM 1012 has an eccentric circular footprint, and a substantially concave cross-sectional profile.

Figure 11:
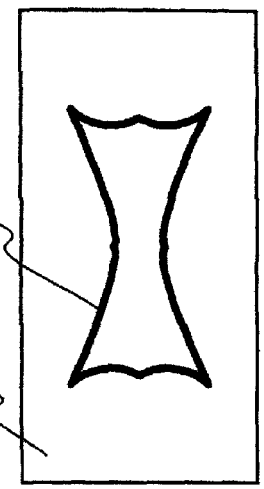
FIG. 11 is a plan schematic view of a TIM-stamped heat spreader assembly according to an embodiment.

FIG. 11 is a schematic plan view of a heat spreader assembly according to an embodiment. The heat spreader assembly includes a heat spreader substrate 1110 according to the various embodiments set forth in this disclosure, and a TIM 1112 according to the various embodiments set forth in this disclosure. By way of non-limiting example, the TIM 1112 is a lead-free solder material and the heat spreader substrate 1110 is a silver-gold-clad copper composite, although any of the materials combinations can be used as set forth in Examples 1 and 2, FIGS. 9-10 and 12-13, and elsewhere in this disclosure. The TIM 1112 has a multiple-concave contours footprint, and a substantially undulating cross-sectional profile.

Figure 12:
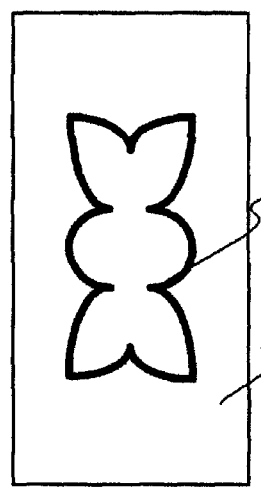
FIG. 12 is a plan schematic view of a TIM-stamped heat spreader assembly according to an embodiment.

FIG. 12 is a schematic plan view of a heat spreader assembly according to an embodiment. The heat spreader assembly includes a heat spreader substrate 1210 according to the various embodiments set forth in this disclosure, and a TIM 1212 according to the various embodiments set forth in this disclosure. By way of non-limiting example, the TIM 1212 is a lead-containing solder material and the heat spreader substrate 1210 is a tin-nickel-clad copper composite, although any of the materials combinations can be used as set forth in Examples 1 and 2, FIGS. 9-11 and 13, and elsewhere in this disclosure. The TIM 1212 has a multiple-convex contours footprint, and a substantially rectangular cross-sectional profile.

Figure 13:
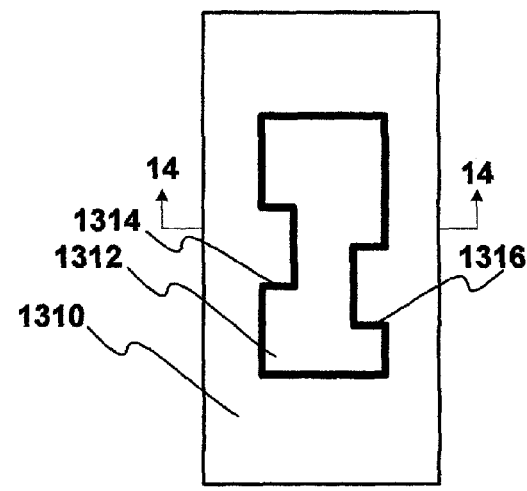
FIG. 13 is a plan schematic view of a heat spreader assembly according to an embodiment.

FIG. 13 is a schematic plan view of a heat spreader assembly according to an embodiment. The heat spreader assembly includes a heat spreader substrate 1310 according to the various embodiments set forth in this disclosure, and a TIM 1312 according to the various embodiments set forth in this disclosure. By way of non-limiting example, the TIM 1312 is an indium-containing solder material and the heat spreader substrate 1210 is a copper material, although any of the materials combinations can be used as set forth in Examples 1 and 2, FIGS. 9-12, and elsewhere in this disclosure. The TIM 1312 has at least one recess 1314 and 1316 which are placed to prevent reflow of the TIM 1312 into a component which will be placed near the die during reflow. Accordingly, the TIM has a rectilinear, recessed footprint. For example, a decoupling capacitor (FIG. 14) can be placed into a chip package with a heat spreader assembly according to an embodiment. The decoupling capacitor takes a position of one of the at least one recesses 1314 and 1316. During reflow of the TIM 1312, lateral flow is minimized into the region of one of the at least one recesses 1314 and 1316. In this non-limiting example, the TIM 1312 includes a substantially convex cross-sectional profile, which profile is enhanced by an undulating surface.

Figure 14:
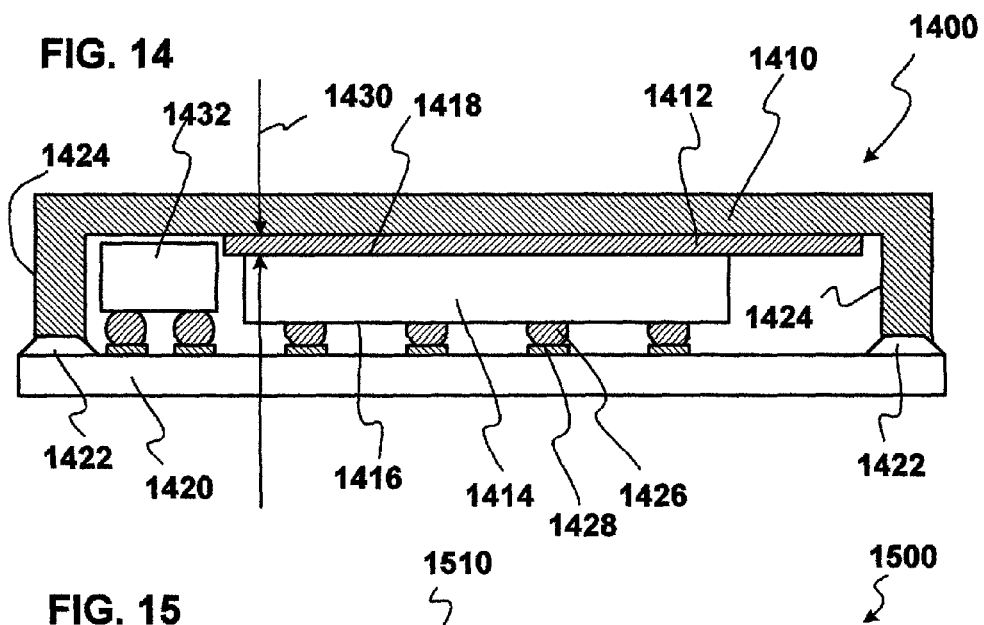
FIG. 14 is a cross-section of a chip package according to an embodiment.

FIG. 14 is a cross-section of a chip package 1400 according to an embodiment. The chip package 1400 includes an IHS 1410 and a TIM 1412 according to an embodiment set forth in this disclosure. The chip package 1400 also includes a die 1414 with an active surface 1416 and a backside surface 1418. The die 1414 is reflow bonded to the TIM 1412.

It is noted that in FIG. 14, the IHS 1410 is attached to a mounting substrate 1420 such as a printed circuit board (PCB), a main board, a motherboard, a mezzanine board, an expansion card, or another mounting substrate 1420, with a bonding material 1422 that secures a lip portion 1424 of the IHS 1410 thereto. In one embodiment, the heat spreader substrate is a heat sink without a lip portion 1424 such as a simple planar heat sink. In one embodiment the IHS 1410 includes a heat pipe configuration. By reading this disclosure, one recognizes that the heat spreader assemblies depicted in FIGS. 3-6 can be pre-processed into IHS shapes such as the IHS 210 depicted in FIG. 2. Thereafter, the TIM stamping process can be carried out as depicted in FIG. 2.

It is noted in FIG. 14 that the die 1414 is disposed between the TIM 1412 and a series of electrical bumps 1426 that are in turn each mounted on a series of bond pads 1428. The electrical bumps 1426 make contact with the active surface 1416 of the die 1414. The TIM 1412 also makes thermal contact with the backside surface 1418 of the die 1414.

Reflow of the TIM 1412 with the die 1414 can be carried out by thermal processing. Heat can be applied by conventional processes such that, if present, the active element materials reach the melting zone of the base solder. For example, where the base solder includes indium, heating is carried out in a range from about 150° C. to about 200° C.

During reflow of the TIM 1412, the active element(s), if present, dissolve and migrate to the backside surface 1418 of the die 1414. Simultaneously, the base solder bonds and/or anneals to the IHS 1410 in a reflow manner that lowers the voids content between the IHS 1410 and the die 1414. In one embodiment, the solder joint that is formed by the solder material of the TIM 1412 forms a bond strength in a range from about 1,000 psi to about 2,000 psi.

FIG. 14 also depicts, by way of non-limiting example, a component 1432 that is disposed upon the mounting substrate, and that further has a profile that can touch the IHS 1410. In one embodiment, the component 1432 is a decoupling capacitor 1432 that is placed close to a processor 1414. In this embodiment, the TIM 1412 has a recess (not pictured) which is similar to one of the at least one recesses 1314 and 1316. A view of FIG. 14 with respect to the heat spreader substrate 1410 and the TIM 1412 can be seen along the cross-section line 14-14 in FIG. 13. The cross-section line 14-14 intersects the recess 1316, which accommodates the component 1422 in FIG. 14. The recess 1316 is present to resist and/or avoid contact of the TIM 1412 (FIG. 14) with the component 1432 during reflow processing.

A bond line thickness (BLT) 1430 is exhibited as the thickness of the TIM 1412 after reflow bonding of the die 1414 to the IHS 1410. In one embodiment, the TIM supply 114, depicted in FIG. 1, is prepared with a tolerance which results in a BLT which improves process yield. According to an embodiment, the BLT can be controlled by constraining the flatness variation during the supply phase of the process. By rejecting feedstocks that have significantly varying thicknesses, a substantially constant BLT can be achieved. In one embodiment, the BLT 1430 is in a range from about 2 micron to about 2,000 micron. In one embodiment, the BLT 1430 is in a range from about 10 micron to about 1,000 micron. In one embodiment, the BLT 1430 is in a range from about 20 micron to about 200 micron.

Figure 15:
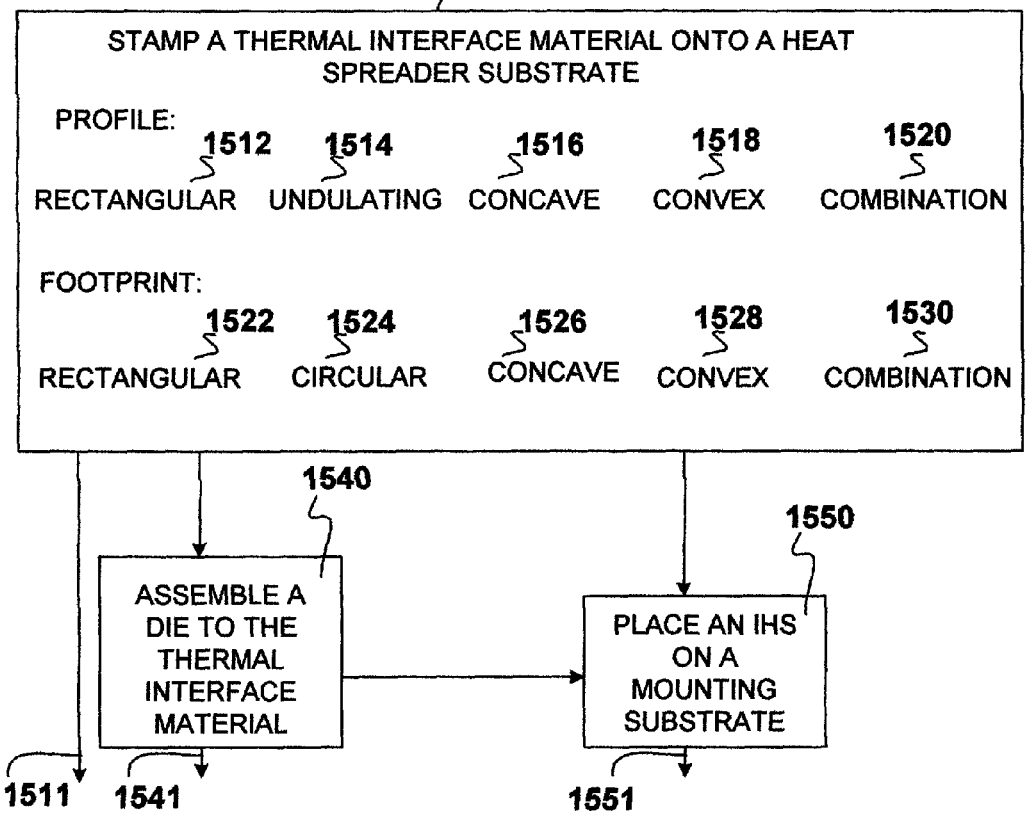
FIG. 15 is a process flow diagram according to various embodiments.

FIG. 15 is a process flow diagram according to various embodiments. The fabrication of a microelectronic package includes the formation of the TIM-stamped heat spreader substrate article according to embodiments set forth in this disclosure. The process 1500 includes embodiments which relate to the formation of a TIM-stamped heat spreader substrate article.

At 1510, TIM-stamped heat spreader substrate article is formed.

Various cross-sectional profiles can be achieved during the stamping process. At 1512, a rectangular cross-sectional profile is formed. FIG. 3 depicts an illustrated example of this embodiment. At 1514, a curvilinear cross-sectional profile is formed. FIGS. 4-6 depict illustrated examples of this embodiment. At 1516, a concave cross-sectional profile is formed. FIG. 5 depicts an illustrated example of this embodiment. At 1518, a convex cross-sectional profile is formed. FIG. 4 depicts an illustrated example of this embodiment. At 1520, a combination of cross-sectional profiles is formed. In this embodiment, any of the structures depicted in FIGS. 3-6 can be post-stamping treated by scoring an undulating surface treatment into the TIM. In an alternative of this embodiment, any two of the cross-sectional profiles depicted in FIGS. 3-6 can be fractionally combined during the stamping process, such as by stamping with a press positive that has a combination of cross-sectional profiles.

Various TIM footprints can be achieved simultaneously with formation of a given cross-sectional profile during the TIM-stamping process. At 1522, a rectangular TIM footprint is formed on the heat spreader substrate. FIG. 9 depicts an illustrated example of this embodiment. At 1524, a curvilinear, particularly an eccentric circular TIM footprint is formed on the heat spreader substrate. FIG. 10 depicts an illustrated example of this embodiment. At 1526, a concave TIM footprint is formed on the heat spreader substrate. FIGS. 11 and 13 depict illustrated examples of these embodiments. At 1528, a convex TIM footprint is formed on the heat spreader substrate. FIG. 12 depicts an illustrated example of this embodiment. At 1530, a combination of TIM footprint shapes is formed on the heat spreader substrate. In an alternative of this embodiment, any two of the TIM footprints depicted in FIGS. 9-13 can be fractionally combined during the stamping process, such as by stamping with a press positive that has a combination of TIM footprints.

At 1511, one process embodiment is completed.

At 1540, a method combines with the TIM-stamping process by assembling a die to the TIM, which in turn was previously stamped onto the heat spreader substrate or the IHS. This method includes reflow of the TIM appropriate for the TIM and the die.

At 1541, one method embodiment is completed.

At 1550, the TIM-stamped heat spreader substrate, or a TIM-stamped IHS, is placed upon a mounting substrate.

At 1551, one method embodiment is completed.

Figure 16:
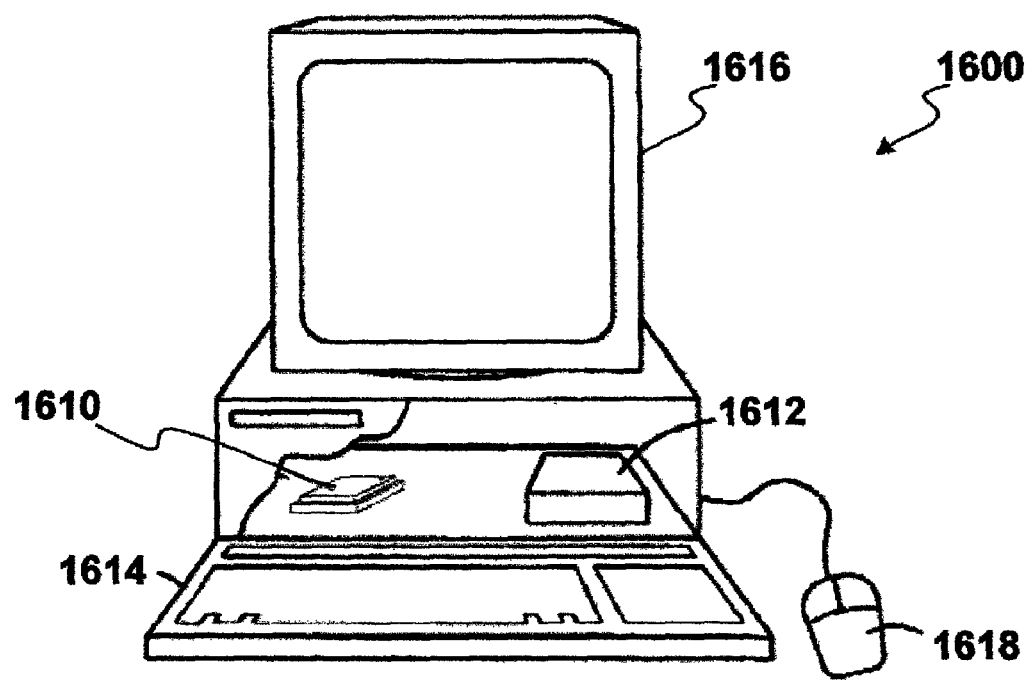
FIG. 16 is a depiction of a system according to an embodiment.

FIG. 16 is a depiction of a system according to an embodiment. The several embodiments set forth in this disclosure are described primarily in the context of utilization with an integrated circuit flip chip configuration, packaged with a mounting substrate and a TIM-stamped heat spreader substrate or a TIM-stamped IHS as shown in the accompanying figures. Other embodiments, however, can be employed, that are not limited to just this particular configuration, and the claimed subject matter is applicable to other types of microelectronic packages. For example, microelectronic packages in accordance with the claimed subject matter may include packages with varying form factors, such as, for example, pin grid array, ball grid array, ball grid array with pinned interposers and wire bonding.

FIG. 16 is a depiction of a computing system. One or more of the foregoing embodiments of a microelectronic package may be utilized in a computing system, such as a computing system 1600 of FIG. 16. The computing system 1600 includes at least one processor (not pictured) under a TIM-stamped IHS 1610 or a TIM-stamped heat spreader substrate 1610, a data storage system 1612, at least one input device such as keyboard 1614, and at least one output device such as monitor 1616, for example. The computing system 1600 includes a processor that processes data signals, and may comprise, for example, a PENTIUM®III, a PENTIUM® 4, or CENTRINO™ microprocessor, available from Intel Corporation. In addition to the keyboard 1614, the computing system 1600 can include another user input device such as a mouse 1618, for example. The computing system 1600 may utilize one or more microelectronic packages such as described in one or more of the foregoing embodiments. For purposes of this application, a computing system 1600 embodying components in accordance with the claimed subject matter may include any system that utilizes a microelectronic package, which may include, for example, a data storage device such as dynamic random access memory, polymer memory, flash memory, and phase-change memory. The microelectronic package can also include a die which contains a digital signal processor (DSP), a micro controller, an application specific integrated circuit (ASIC), or a microprocessor. It can now be appreciated that embodiments set forth in this disclosure can be applied to devices and apparatuses other than a traditional computer. For example, a die can be packaged with an embodiment of the TIM-stamped heat spreader substrate and placed in a portable device such as a wireless communicator or a hand-held such as a personal data assistant and the like. Another example is a die that can be packaged with an embodiment of the TIM-stamped heat spreader substrate and placed in a vehicle such as an automobile, a locomotive, a watercraft, an aircraft, or a spacecraft.

It is emphasized that the Abstract is provided to comply with 37 C.F.R. §1.72(b) requiring an Abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description of Embodiments of the Invention, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. An article comprising:
   a heat spreader substrate;
   a thermal interface material over the heat spreader substrate; and
   a diffusion bonding zone between the heat spreader substrate and the thermal interface material, wherein the diffusion bonding zone includes at least a portion of the thermal interface material, and wherein the diffusion bonding zone is characteristic of a stamping process.

2. The article according to claim 1, wherein the diffusion bonding zone has a porosity of less than about 5 percent.

3. The article according to claim 1, further including:
   a cladding layer disposed upon the heat spreader substrate, wherein the diffusion bonding zone includes at least a portion of the cladding layer and at least a portion of the thermal interface material.

4. The article according to claim 1, wherein the thermal interface material is selected from a base solder alloyed with an active element material, indium, tin, silver, tin-silver, lead, tin-lead, hafnium, cerium, lutetium, other rare earth elements, titanium, tantalum, niobium, nickel, cobalt, palladium, copper, iron, magnesium, strontium, cadmium, and combinations thereof.

5. The article according to claim 1, wherein the thermal interface material includes a footprint shape on the heat spreader substrate, selected from rectangular, rectilinear, circular, eccentric circular, curvilinear, concave, convex, and a combination thereof.

6. The article according to claim 1, wherein the diffusion bonding zone has a porosity of less than about 5 percent, further including:
   a cladding layer disposed upon the heat spreader substrate, wherein the diffusion bonding zone includes at least a portion of the cladding layer and at least a portion of the thermal interface material.

7. The article according to claim 1, further including:
   a cladding layer disposed upon the heat spreader substrate, wherein the diffusion bonding zone includes at least a portion of the cladding layer and at least a portion of the thermal interface material, and wherein the thermal interface material is selected from a base solder alloyed with an active element material, indium, tin, silver, tin-silver, lead, tin-lead, hafnium, cerium, lutetium, other rare earth elements, titanium, tantalum, niobium, nickel, cobalt, palladium, copper, iron, magnesium, strontium, cadmium, and combinations thereof.

8. A package comprising:
   a die bonded to an article, the article including:
      a heat spreader substrate;
      a thermal interface material over the heat spreader substrate; and
      a diffusion bonding zone between the heat spreader substrate and the thermal interface material, wherein the diffusion bonding zone includes at least the thermal interface material, and wherein the diffusion bonding zone is characteristic of a stamping process.

9. The package according to claim 8, further including:
   a mounting substrate, wherein the heat spreader substrate is disposed on the mounting substrate.

10. A computer system comprising:
   a microelectronic die disposed upon a mounting substrate;
   an integrated heat spreader disposed over the microelectronic die, the integrated heat spreader, including:
      a heat spreader substrate;
      a thermal interface material over the heat spreader substrate; and
      a diffusion bonding zone between the heat spreader substrate and the thermal interface material, wherein the diffusion bonding zone includes at least a portion of the thermal interface material, and wherein the diffusion bonding zone is characteristic of a stamping process; and
   random access memory coupled to the microelectronic die.

11. The computer system according to claim 10, wherein the computer system is disposed in one of a computer, a wireless communicator, a hand-held device, an automobile, a locomotive, an aircraft, a watercraft, and a spacecraft.

12. The computer system according to claim 10, wherein the microelectronic die is selected from a data storage device, a digital signal processor, a micro controller, an application specific integrated circuit, and a microprocessor.

* * * * *